US012724101B2

(12) United States Patent
Fan et al.

(10) Patent No.: US 12,724,101 B2
(45) Date of Patent: Sep. 1, 2026

(54) TESTER WITH SELF-TEST FUNCTIONS

(71) Applicant: Fluke Corporation, Everett, WA (US)

(72) Inventors: Songnan Fan, Shanghai (CN); Hui Zhao, Shanghai (CN)

(73) Assignee: Fluke Corporation, Everett, WA (US)

( * ) Notice: Subject to any disclaimer, the term of this patent is extended or adjusted under 35 U.S.C. 154(b) by 250 days.

(21) Appl. No.: 18/595,159

(22) Filed: Mar. 4, 2024

(65) Prior Publication Data

US 2025/0216494 A1 Jul. 3, 2025

Related U.S. Application Data

(63) Continuation-in-part of application No. PCT/CN2023/143166, filed on Dec. 29, 2023.

(51) Int. Cl.
*G01R 35/00* (2006.01)
*G01R 15/12* (2006.01)

(52) U.S. Cl.
CPC .......... *G01R 35/00* (2013.01); *G01R 15/125* (2013.01)

(58) Field of Classification Search
CPC .............................. G01R 35/00; G01R 15/125
See application file for complete search history.

(56) References Cited

U.S. PATENT DOCUMENTS 4,804,908 A * 2/1989 Mitchell .............. G01R 15/125 324/157
4,821,217 A * 4/1989 Jackson ................ G01M 15/05 701/32.8
5,781,024 A 7/1998 Blomberg et al.
8,336,190 B2 * 12/2012 Aikins ..................... G01R 1/28 29/874
2008/0111560 A1 5/2008 Regier
2010/0013511 A1 * 1/2010 Li ........................ G01R 15/125 324/754.02
2018/0323605 A1 * 11/2018 Kinsel .................... H02H 3/334

FOREIGN PATENT DOCUMENTS

CN 109581022 A 4/2019
CN 116466283 A 7/2023
JP H01102783 U 7/1989
JP 2002-350177 A 12/2002

OTHER PUBLICATIONS

International Search Report for International Application No. PCT/CN2023/143166, mailing date Sep. 4, 2024, 4 pages.
Written Opinion of the International Searching Authority for International Application No. PCT/CN2023/143166, mailing date Sep. 4, 2024, 5 pages.

* cited by examiner

*Primary Examiner* — Alesa Allgood
(74) *Attorney, Agent, or Firm* — Seed Intellectual Property Law Group LLP

(57) ABSTRACT

A tester includes self-test functions to test a state of a measurement circuit in the tester. For example, the self-test functions test an electrical state, e.g., electrical properties or connection or disconnection states, of a component of the measurement circuit. The self-test functions also test the signal state of an electrical component in the measurement circuit, which may include signal detection, signal transmittance, or measurement properties of the electrical component. The self-test functions improve the user experience of the tester from safety and reliability perspectives.

20 Claims, 6 Drawing Sheets

TESTER WITH SELF-TEST FUNCTIONS

BACKGROUND

Technical Field

The present disclosure relates generally to electrical testers. More particularly, the disclosure relates to a digital multimeter having self-test functions.

Description of the Related Art

Digital multimeters ("DMM") function to measure different electrical parameters as needed for service, troubleshooting, and maintenance. Such parameters may include AC voltage and current, DC voltage and current, resistance and continuity. Sometimes, a DMM may measure other parameters, such as capacitance and temperature. A DMM will often be configured as a handheld unit having a rotary knob by which various functions are selected. Multiple lead jacks may be provided in the case (i.e., housing) of the unit for receiving test leads. The specific jack or jacks used may depend on the function that has been selected. A display, e.g., an LCD display, provides a reading of the measured parameter.

The plurality of lead jacks or input terminals includes a common input terminal and one or more test input terminals. The test input terminals may include a volt/ohms input terminal and one or more amps or microamps input terminals. The common input terminal is coupled to a reference node of the DMM, e.g., a ground, and a lead of a test probe is inserted into one of the test input terminals for the respective measurement tasks. For example, to measure microamps, a DMM user must disconnect the test probe from the volt/ohms terminal and connect it to the microamps terminal. Some DMMs may include a single test input terminal. That is, a current measurement and a voltage measurement can be conducted using the same test input terminal under separate measurement modes selected by a user through a user interface of the DMMs. Further, some DMMs may include test terminals different from test probes and input lead jacks. For example, DMMs may include a contact-free test end, e.g., a U-shaped recess portion, having measurement sensors embedded therein. The measurement sensors function to measure the electrical parameters of an object received in the U-shaped recess portion without galvanically contacting the object.

There are some safety components on the printed circuit assembly of a DMM. The safety components are configured to protect users or the DMM in different measurement situations, e.g., where excessive voltages are applied to the measurement terminals.

BRIEF SUMMARY

A digital multimeter includes self-test functions. The self-test functions automatically test a state of a measurement circuit of the digital multimeter. For example, the self-test functions test an electrical state, e.g., electrical properties or connection or disconnection states, of a component of the measurement circuit. The self-test functions also test the signal state of an electrical component in the measurement circuit, which may include signal detection, signal transmittance, or measurement properties of the electrical component. The self-test functions improve the user experience of the DMM from safety and reliability perspectives.

The self-test functions and related circuit configurations are integrated into the DMM circuitry and can be selected and activated through a user interface. Before a user uses the DMM for measurement tasks, the user can activate the self-test functions to check functionality, e.g., if safety-related components of the DMM circuitry are working properly.

With user selections, a controller of the DMM controls the formation, e.g., via connection or disconnection of circuit components, of a test or a check path, which couples a to-be-tested component to a test signal source or a check signal source. An electrical property (e.g., a voltage value, a current value, a resistance value, etc.) or an electrical signal is detected adjacent to the to-be-tested components and is analyzed by the controller to determine a state of the to-be-tested component, e.g., the electrical state or signal state. The results of the analysis can be presented to a user through a user interface of the DMM.

These concepts and features, as well as other concepts and features, are illustrated by various embodiments of the example DMM devices described herein.

DETAILED DESCRIPTION

Figure 1:
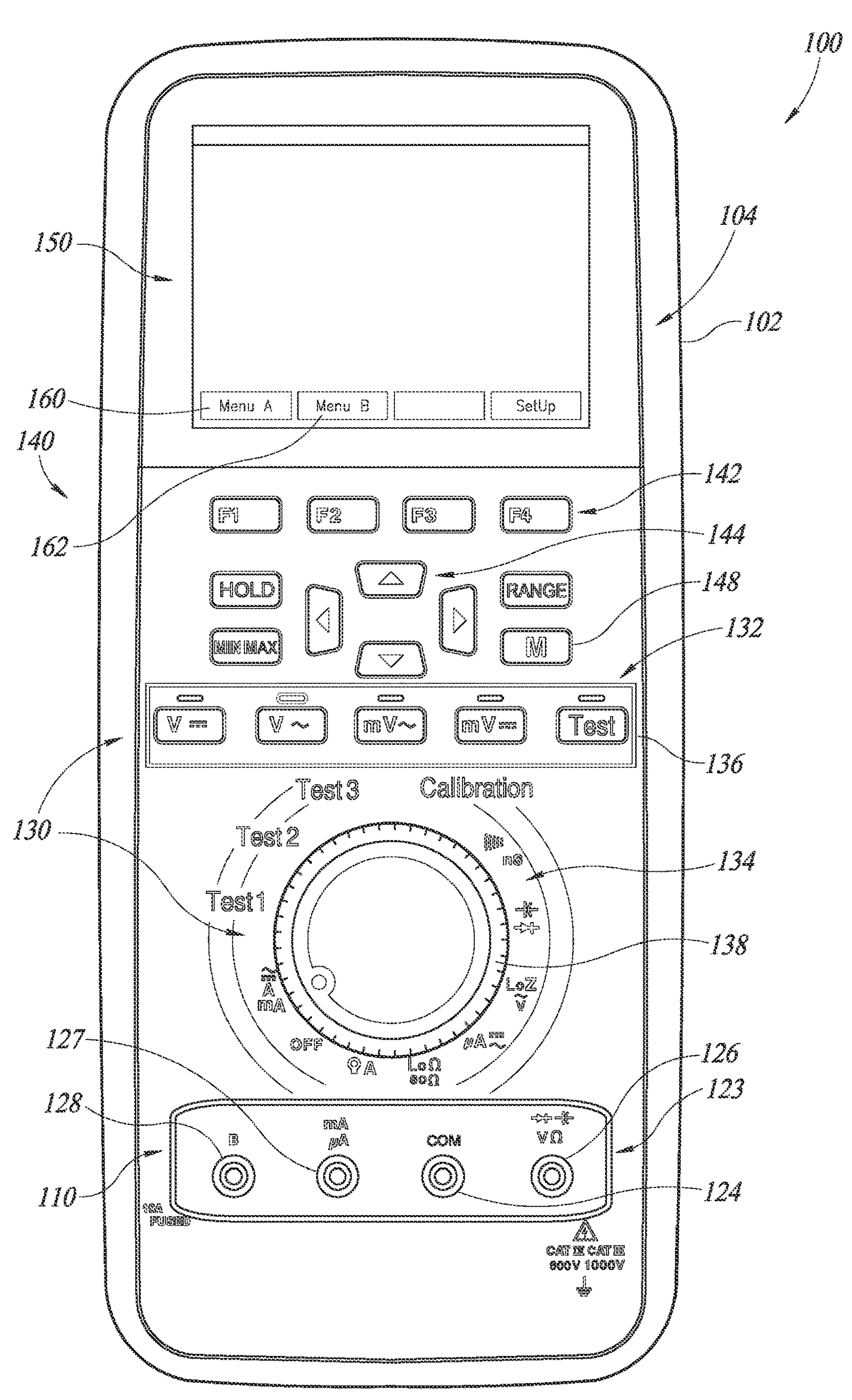
FIG. 1 shows a front view of an example user interface of an example tester according to at least one embodiment of the present disclosure.

A tester, e.g., a digital multimeter ("DMM"), may include various safety components on the printed circuit assembly of the DMM. The safety components are configured to protect users or the DMM in different measurement situations, e.g., where excessive voltages are applied to the input terminals. For example, a DMM may include a high voltage positive temperature coefficient (PTC) thermistor ("PTC") coupled in series between an input terminal and a voltage measurement component. Under a normal working condition, the resistance of the PTC may vary between high-resistance states and low-resistance states based on the voltage or current applied to the PTC, which helps to prevent high current or high voltage from being applied to vulnerable measurement components of the DMM. For example, the resistance of the PTC will change to a high value when a high voltage is applied, and then withstand the high voltage to protect the measurement circuits. In a typical application scenario, a resistor, e.g., of 1k ohm, may be coupled in series with the PTC. If the PTC or the resistor is short-circuited or disconnected, the DMM or a user may be at risk when the DMM is used for high-voltage measurement.

For another example, a DMM may include a resistor-capacitor (RC) series circuit in a measurement signal path. The RC series circuit may include a discharge resistor and a high voltage capacitor, which are configured to, among others, be a filter to insulate a DC voltage when the DMM is used to measure an AC voltage. If this RC series circuit is short-circuited, disconnected, or bypassed, the DMM cannot measure the AC signal correctly.

For another example, a DMM may include a set of high-rated voltage resistors ("resistor network") for measuring AC voltage or DC voltage. Each resistor in the resistor network functions as part of a resistive voltage divider, which ensures that a voltage signal having an appropriate dynamic range of voltage value is fed into the measurement components, e.g., the analog-to-digital ("A/D") converter. For example, when a high voltage is measured, a smaller resistor of the resistor network is selected to make the divided voltage signal within the dynamic range of the A/D converter. The resistor network can make the DMM measure the voltage correctly.

Moreover, DMMs typically include RMS (root-mean-square) to DC (direct current) converters, A/D converters, and current sources that are used to measure the resistance, capacitance, frequency, and other electrical signals. For example, the RMS-to-DC converters are used to measure AC (alternating current) signals. The current source provides excitation for measuring resistors and capacitors. The A/D converter is used for reading signal measurements by a digital processing unit, e.g., a controller.

It is recognized in the present disclosure that existing DMM solutions have no internal self-check function for testing whether the safety-related components or other components involve dysfunctions. If the safety-related electronic components do not function properly in harsh measurement environments or applications, it can be very dangerous for the front-line worker, especially when the DMM is used to measure high voltages or high currents.

The specification herein provides implementations directed to DMMs having self-check functions and related circuitry configurations. The self-check functions can be implemented through one or more new circuitry configurations and firmware configurations, which test one or more target components or to-be-tested components on the printed circuit assembly and cause the test results to be presented to a user, e.g., on a display of the DMM.

The self-check function can check safety-related components on the printed circuit assembly (PCA) of the DMM within a short period. An additional device or accessories are not needed for this self-test function. These safety components on the DMM are practically useful. They can protect the end user and the DMM itself, even when the DMM involves internal misconnections.

In the illustrated embodiment of FIG. 1, tester 100 includes a body or box frame 102 and a user interface (or I/O interface) 104 on one or more surfaces of the box frame 102. The user interface 104 includes a measurement section 110, a mode selection section 130, a keypad section 140, and a display section or display 150.

The measurement section 110 includes measurement interfaces for connecting measurement equipment, e.g., probes. As an illustrative example, FIG. 1 shows measurement section 110 having one or more measurement sets 123 configured for one or more measurement channels. For example, the measurement set 123 includes a common (COM) terminal 124, which is configured to be a return terminal (or point of reference) for all measurement modes of the measurement channel.

The measurement set 123 includes one or more input terminals 126, 127, and 128, respectively. For example, as illustratively shown in FIG. 1, the measurement set 123 includes an input terminal 126 for voltage measurement modes (AC/DC), an input terminal 127 for milliamps and microamps (AC/DC) level current measurement modes, and an input terminal 128 for other measurement modes including those for measuring resistance, diode test, capacitance, and temperature. Further, terminal 128 may be used for connection to other sensor probes to expand the measurement parameters, which can be selected by a measurement mode selection mechanism 130, like control relays 132 or control rotary 134.

In some implementations, the control relays 132, e.g., electro-mechanical relay buttons, are each configured to activate a measurement mode of a measurement channel. The physical signal path of the measurement circuit corresponding to the measurement modes is switched by a set of electro-mechanical relays, under firmware control as directed by the inputs through the relay buttons of the control relays 132. FIG. 1 illustratively shows that control relays 132 includes relay buttons for measurement modes of AC voltage, DC voltage, AC millivolts, and DC millivolts, which do not limit the scope of the disclosure. The control relays 132 may include relay buttons or menus under a relay button control to select or activate other measurement modes to measure other parameters, like capacitance, resistance, continuity, or other physical parameters like temperature, which are all included in the scope of the disclosure.

As shown in FIG. 1, control relays 132 include a "Test" relay button 136, which is configured to activate the self-test function(s) of the DMM.

In some implementations, the control rotary 134 is a rotary switch that includes, as illustratively shown in FIG. 1, positions for selecting measurement modes of, e.g., capacitance, diode test, AC voltage/LoZ (which prevents reading due to ghost voltage), AC/DC amps and milliamps, AC/DC microamps, temperature, resistance, and continuity, which still do not limit the scope of the disclosure. Further, the control rotary 134 includes positions for various self-test modes, "Test 1," "Test 2," "Test 3," and "Calibration," which could be selected to activate testing of corresponding components or functions.

It should be appreciated that in various implementations, a DMM may include only one of the set of control relays 132 or control rotary 134, and achieve a similar capacity of measurement or self-test mode selections as described herein with respect to the example implementations of having both control relays 132 and control rotary 134. Further, the control relays 132 and/or the control rotary 134 or any relay button or selection positions thereof, respectively, may be used together with more options that are enabled through the display section 150. The scope of the specification herein is not limited by any specific configuration of the control relays 132 or the control rotary 134.

In some implementations, the user interface 104 includes a master switch 148 configured to enable users to use one of the control rotary 134 or the display section 150 to control the measurement mode or self-test mode selections.

In some implementations, the measurement mode selection or the self-test mode selection may be conducted remotely by a remote controller that is communicatively coupled to tester 100.

The keypad section 140 includes various buttons for various functions, including standard digital multimeter buttons, such as "HOLD," "MINMAX," "RANGE," "Function," "Log" other buttons for audible signal, relative mode, cursor buttons, information, etc. FIG. 1 illustratively shows some of the standard buttons, which does not limit the scope of the disclosure. The keypad section 140 also includes one or more menu buttons 142, illustratively shown as four buttons, "F1," "F2," "F3," and "F4," configured to activate functions related to, among others, the data processing and presentation of the measurement results or the self-test results. The functions may include calculation function, plotting or graphing function, data fusing function, data interpolating function, and other functions that process or present measurement results or self-test results. The cursor buttons 144 are configured to be used to, among others, make additional selections for those functions, together with the menu buttons 142.

In some implementations, cursor buttons 144 can be used with the display section 150 to select various self-test modes or to display various test results corresponding to the selected self-test modes.

The display section 150 may include a display panel of a plurality of pixels, e.g., a LED or LCD display panel, and a display module including various circuitry that enable the pixels of the display panel to display information. The display section is configured to display measurement results or self-test results for various self-test modes.

The display section 150 may also include a capacitive touch screen that includes touchscreen buttons 160, 162 for the menu selections of various functions, parameters, or display setups for the measurement functions or the self-test functions, respectively. The menus can be activated through the touchscreen button together with or separately from the mode selection of each measurement or self-test function. Other touchscreen buttons, like a "SetUp" button, are also possible and included in the scope of the disclosure. The Setup button may be used to enable user configuration of various self-test functions, like those selectable via rotary positions "Test 1," "Test 2," "Test 3," and "Calibration."

With the graphing function of a processing unit or a controller, tester 100 is able to display graphical voltage and current measurements or self-test results, providing instant feedback to a user about the situation being measured or tested.

Figure 2:
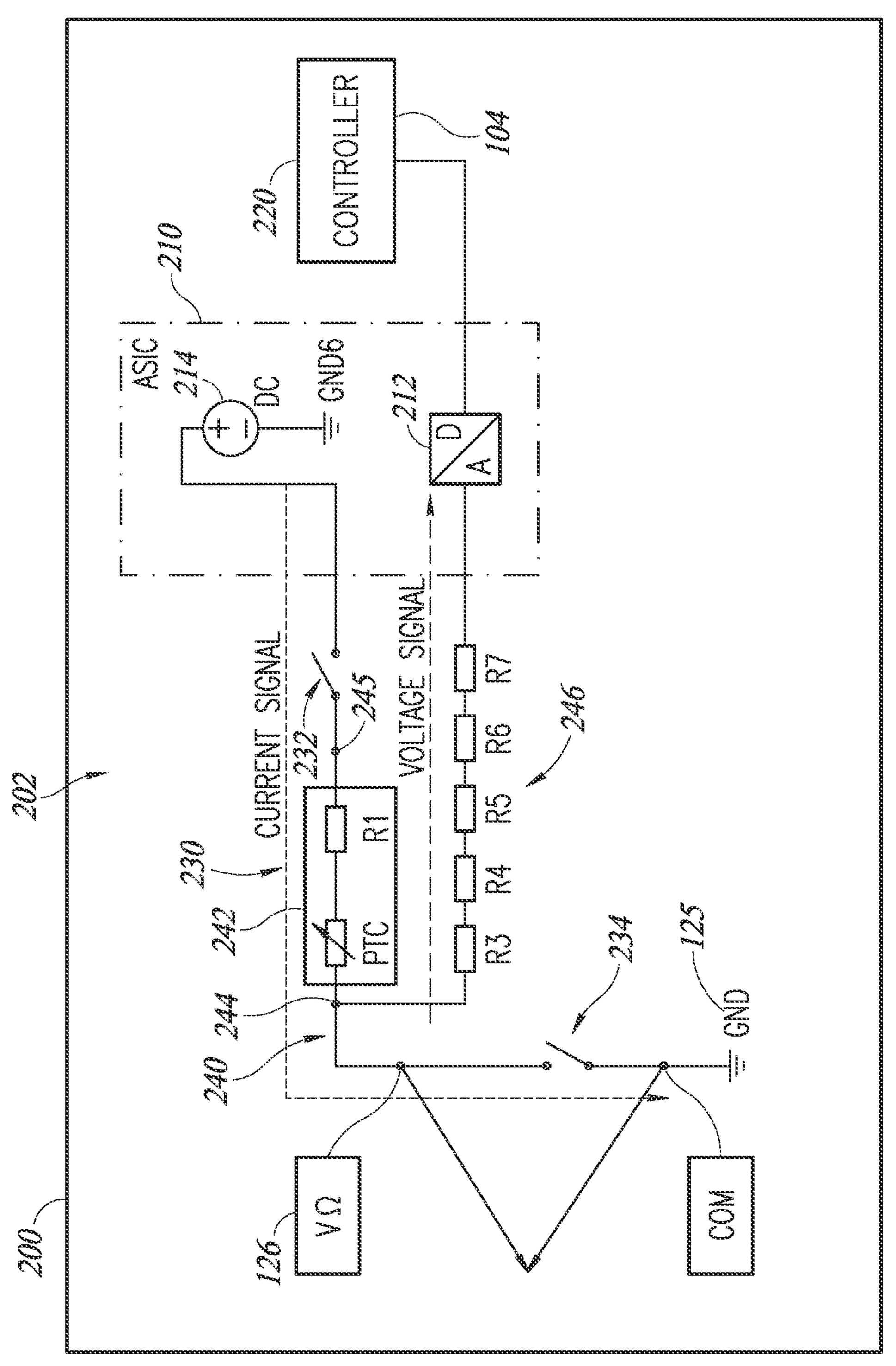
FIGS. 2-4 show various portions of circuit elements of an example tester according to at least one embodiment of the present disclosure.

FIG. 2 shows schematically a first portion 202 of an example printed circuit assembly ("PCA") 200. As shown in FIG. 2, the PCA 200 includes a system-on-chip or ASIC chipset ("ASIC") 210, a controller 220, and external circuitry 230. The ASIC 210 is a semiconductor chip having multiple function units integrated thereon and is also referred to as a system-on-chip device. The controller 220 is coupled to the ASIC 210 and/or the external circuitry 230 so that the controller 220 controls the functioning and circuit connections and configurations of the ASIC 210 and/or the external circuitry 230 in the measurement tasks and the self-testing tasks. At least portions of the circuit elements on the ASIC 210 and the external circuitry 230 form the measurement circuit of tester 100. Controller 220 is coupled to components of the measurement circuit to control the measurement and the self-test functions and receive and analyze the data or signals generated in the operation of measurement or self-test functions. For example, the controller 220 is coupled to A/D converter 212 of the ASIC 210 to read the electrical signals flowing from the external circuitry 230 to the A/D converter 212.

The controller 220 is coupled to switches 232, 234 of the external circuitry 230 to form (e.g., through connecting or disconnecting circuit components) a test path 240 that couples a PTC circuit 242 between a DC signal source, e.g., current source or voltage source, 214 and a ground terminal 125, which is connected to the COM terminal 124 (FIG. 1). The DC current source is positioned on the ASIC 210 and is also referred to as a system-on-chip DC current source or ASIC DC current source. When the DC signal source 214 is activated to provide a DC current into the test path 240, the voltage signal at a node 244 adjacent to the PTC circuit 242 (e.g., at a point directly connected to a terminal of the PTC circuit 242) is detected and fed to the A/D converter 212 through a plurality of resistors coupled to one another in series, which function to protect the A/D converter 212. The digital output signal of the A/D converter 212 is read by the controller 220, which analyzes the reading to determine the status of the PTC circuit 242, e.g., whether it is short-circuited or disconnected. For example, controller 220 may compare the voltage reading of the detected voltage value with one or more predetermined threshold ranges of voltage values. If the voltage reading is outside of the threshold range of voltage values, controller 220 may determine that the PTC circuit 242 involves dysfunction. For example, the AD converter 212 may be used to read the voltage at the signal source 214 (circuit arrangement not shown for simplicity), and the output digital signal of the AD converter 212 may be used by the controller 220 to determine whether the PTC circuit 242 is short-circuited or disconnected when the terminals 126 and 124 are short to one another.

In some implementations, the controller 220 is coupled to the user interface 104 (FIG. 1) to receive a user selection of the self-test mode and to present the result of the testing PTC circuit 242 through, e.g., the display section 150 or other approaches. For example, if it is determined that the PTC circuit 242 includes dysfunction, an audio alarm may be triggered to remind a user to stop using the DMM for measurement tasks.

FIG. 2 shows that the whole PTC circuit 242, a PTC thermistor (PTC) and a resistor R1 in series, is included in the test path 240, which does not limit the scope of the disclosure. Controller 220 may control to include only a to-be-test component in a test path. For example, if only the PTC thermistor PTC of the PTC circuit 242 is a to-be-tested component, the test path 240 may be formed to include only the PTC but not the resistor R1 of the PTC circuit 242. Also, it is possible that a test path will be formed to include only the resistor R1, but not the PTC. In some implementations, node 244 for voltage signal detection is configured to be adjacent to the to-be-tested component, e.g., at a point directly connected to a terminal of the to-be-tested component.

The switches 234, 232 are controlled by controller 220 to switch on or off to connect or disconnect the test path 240, automatically without user intervention. For example, controller 220 may control switch 234 to be turned on to short-circuit between the input terminal 126 and the common COM terminal 124 (FIG. 1) in the formation of the test path 240. Depending on the circuit design or configuration requirements of the DMM, additional protection features, e.g., fuses or diodes, may be used together with switch 234 in the circuit configuration of the test path 240. In some implementations, user interaction may be enabled. For example, instead of controller 220 controlling switch 234 to connect or disconnect the test path 240, controller 220 may also prompt a user to short-circuit the input terminal 126 (for voltage measurement modes) and the COM terminal 124. Controller 220 may prompt a message to a user through the display section 150 or through a voice prompt. For example, the circuit in FIG. 2 can be used to determine if the test leads itself are open when a customer is prompted to short the test leads.

Figure 3:
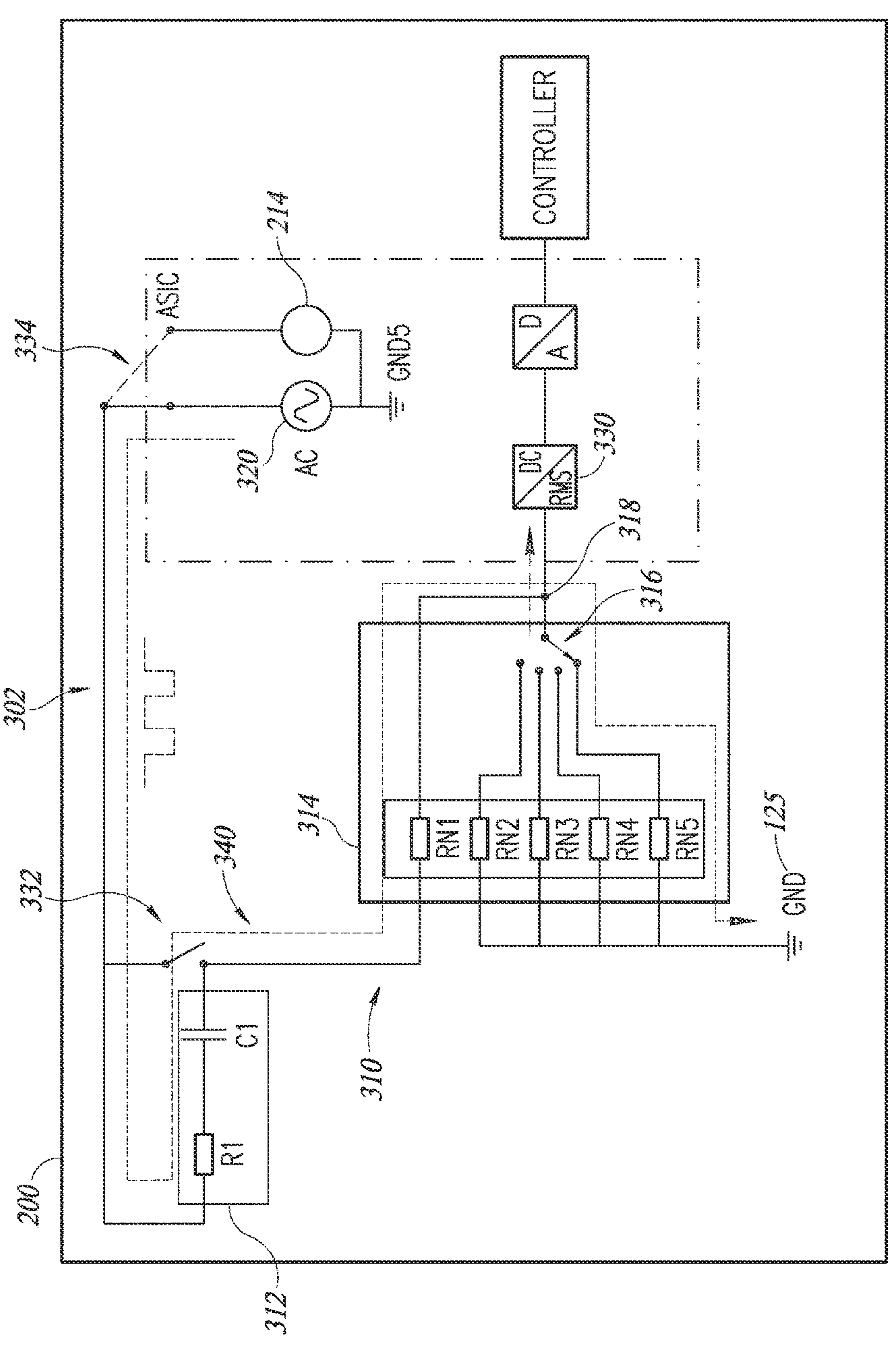

FIG. 3 shows schematically a second portion 302 of an example PCA 200. As shown in FIG. 3, a test path 310 is formed, including an RC series circuit 312 and a resistive voltage divider circuit 314 in series coupled between an AC signal source, e.g., an AC current source or an AC voltage source, 320 and a ground. The AC signal source 320 is positioned on the ASIC 210 and may be referred to as a system-on-chip ("SOC") AC signal source. The resistive voltage divider circuit 314 includes a first resistive unit RN1 selectively coupled to one of a plurality of second resistive units RN2, RN3, RN4, and RN5 (or a resistor network), through a switch 316. The first resistor RN1 is adjacent to the RC series circuit 312 and a second resistor, e.g., RN5, is further from the RC series circuit 312 than the first resistor RN1, and the first resistor RN1 includes a resistance value greater than a resistance value of the second resistor RN5. In this way, more voltage will be allocated to the first resistor RN1 so that the voltage value read by the measurement components is decreased to be at a low level to protect the measurement components. The plurality of second resistive units RN2, RN3, RN4, and RN5 of the resistor network each includes a different resistive value and can be selectively coupled to the first resistive unit RN1 based on the voltage input to be measured so that the voltage value at node 318 is within an acceptable range to be fed into the root mean square (RMS) to direct current ("DC") converter 330 (RMS-to-DC converter"). In some implementations, a ratio of resistance value between the first resistive unit RN1 and a second resistive unit RN2, RN3, RN4, RN5 is within a range from about 10:1 to 1000:1, inclusive. FIG. 3 shows that the first resistive unit RN1 and the second resistive unit RN5 form the resistive voltage divider circuit 314 in the test path 310. In some implementations, the ratio of resistance value between the first resistive unit RN1 and the second resistive unit RN5 is about 10:1.

When the AC signal source 320 is activated to provide an AC signal into the test path 310, the voltage signal at node 318 adjacent to the RC series circuit 312 is detected and fed to the RMS-to-DC converter 330, the output of which is then fed into A/D converter 212. The voltage output of A/D converter 212 is read by controller 220, which analyzes the voltage reading to determine the status of the RC series circuit 312, e.g., whether it is disconnected. For example, controller 220 may compare the voltage reading of the voltage output value of the A/D converter with a predetermined threshold range of voltage values. If the voltage reading is outside of the threshold range of voltage values, controller 220 may determine that the RC series circuit 312 involves dysfunctions.

In some implementations, the controller 220 may also control switches 332, 334 to form a test path 340 that couples the resistive voltage divider circuit 314 of the first resistive unit RN1 and the second resistive unit RN5, between a current source, the AC signal source 320 or a DC signal source (e.g., DC signal source 214), and the ground. The test path 340 may be used to determine whether the resistive voltage divider circuit 314 involves dysfunctions. Note that when the DC current source 214 is used for the test path 340, the voltage signal of node 318 can be fed directly to the A/D converter 212, bypassing the RMS-to-DC converter 330.

In the specification and drawings, AC current source 320 and DC current source 214 are used as examples of a power source that provides electrical signals into the test paths, which do not limit the scope of the disclosure. Other power sources, e.g., voltage sources, may also be used to form the test paths, which are also included in the scope of the disclosure, as can be appreciated by a person having ordinary knowledge of the art.

Figure 4:
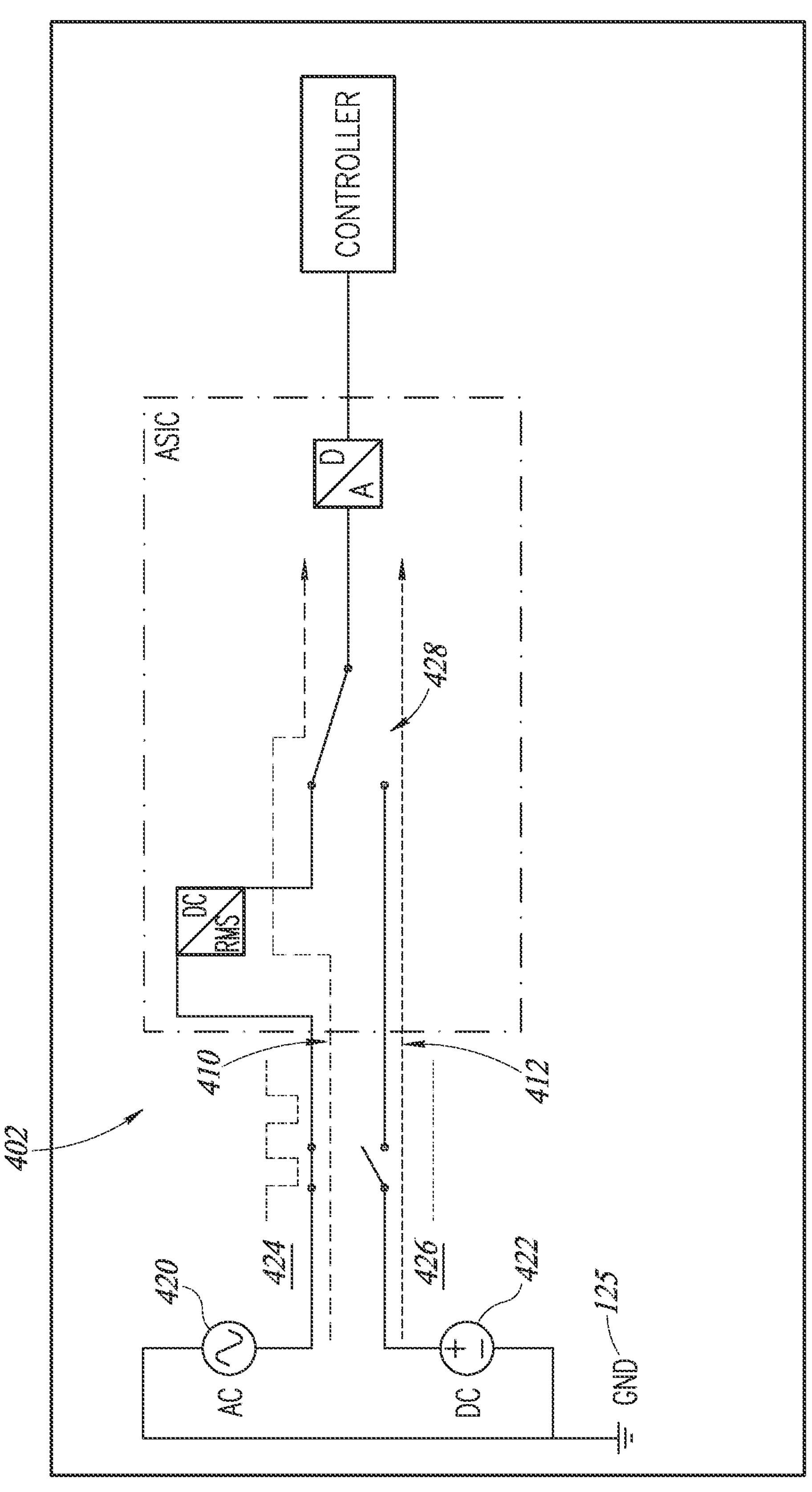

FIG. 4 shows schematically a third portion 402 of an example PCA 200. As shown in FIG. 4, test or check paths 410, 412 can be formed, which each includes a to-be-calibrated component coupled between a check signal source and a signal reader, here a controller. For example, FIG. 4 shows that the check path 410 includes an AC check signal source (or generator) 420, the controller 220, and the to-be-calibrated RMS-to-DC converter 330 and the A/D converter 212 coupled between the AC check signal source 420 and the controller 220 (as a signal reader). In some implementations, the AC check signal source 420 is coupled to apply the AC check voltage signal directly to the RMS-to-DC converter 330. The check path 412 includes a DC check signal source (or generator) 422, the controller 220, and the to-be-calibrated A/D converter 212 coupled between the DC check signal source 422 and the controller 220 (as a signal reader). In some implementations, the DC check signal source 422 is coupled to apply the DC check voltage signal directly to the A/D converter 212.

Switches 424, 426 can be controlled by the controller 220 to connect or disconnect the check paths 410, 412. In some implementations, a switch 428 is controlled by the controller 220 to couple the A/D converter 212 in either one of the check paths 410, 412.

In some implementations, the AC check signal source 420 and the DC check signal source 422 are positioned outside of the ASIC 210. For example, the AC check signal source 420 and the DC check signal source 422 can be standalone components on the PCA 200 or can be located on a separate ASIC or system-on-chip ("SOC") chip different from the ASIC 210 wherein the A/D converter 212 and the RMS-to-DC converter 330 are positioned. Such an external check signal source may provide more accurate check signals to calibrate a component on the ASIC 210 than signal sources positioned on the same ASIC 210. In some implementations, the AC check signal source 420 and the DC check signal source 422 each generate a respective voltage signal.

With the check signal of known values applied to the to-be-tested component, e.g., the RMS-to-DC converter 330 and the A/D converter 212 in the check path 410 or the A/D converter 212 in the check path 412, the voltage readings by the controller 220 can be compared with the known signal values to determine whether the voltage readings are accurate, which indicate the signal state of the to-be-tested components.

Figure 5:
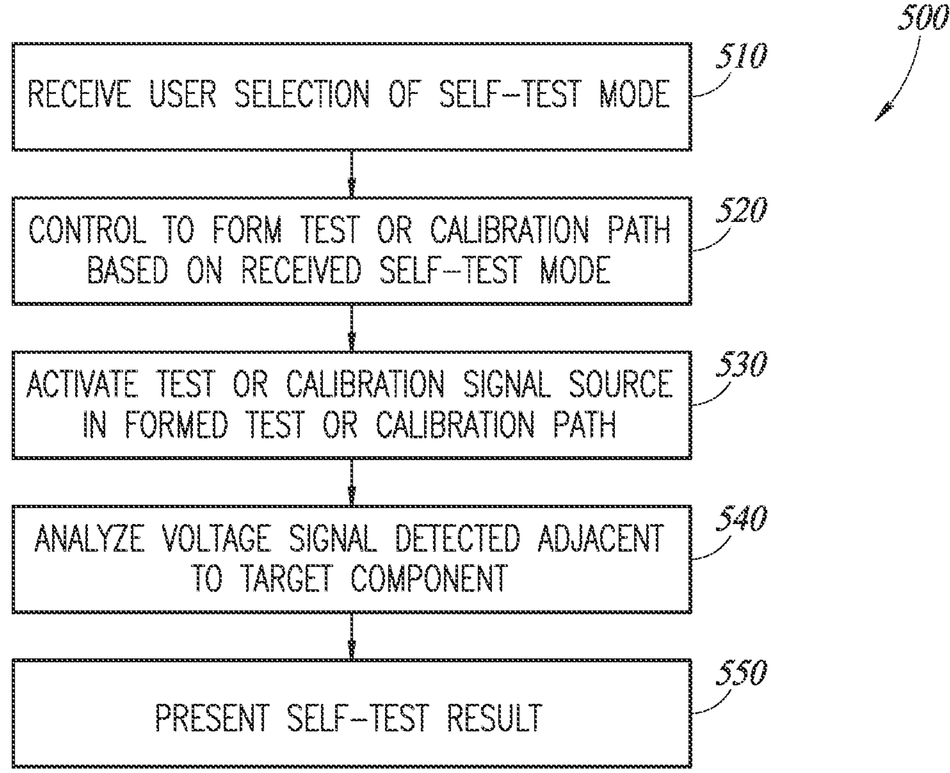
FIG. 5 shows a flow diagram of an example method of conducting a self-test of an example tester according to at least one embodiment of the present disclosure.

FIG. 5 illustrates the operations of tester 100 in an example case. In operation 510, controller 220 receives, via user interface 104 (e.g., the test button 136 and/or the control rotary 134), a user selection of self-test modes. The self-test modes may include the testing of a connecting status of a target component (like whether the target component is short-circuited, disconnected, or normally connected) or the check of a target component. In some implementations, a user selection of the test button 136 may enable all test functions and all check functions, or a specified set of the test functions or the check functions to be conducted, which can be configured by a user using the "SetUp" function on the user interface 104.

In operation 520, controller 220 forms a test path or a check path based on the received self-test mode. For example, in testing the connection status of a component, the controller 220 controls to form a test path that couples a to-be-tested component between a system-on-chip power source and a low-voltage terminal. In testing the signal state of a to-be-tested component, the controller 220 controls to form a check path that couples the to-be-tested component between a signal generator and the controller 220. For example, as shown in FIG. 2, the PTC circuit as a to-be-tested component is coupled between a SOC DC source 214 and the ground terminal. Controller 220 controls switches 234 and 232 to effectuate the formation of the test path 230.

As shown in FIG. 3, the RC series circuit 312 is coupled between a SOC AC signal source 320 and the ground in test path 310.

As shown in FIG. 4, check path 412 includes a to-be-tested A/D converter on the ASIC 210 coupled between external DC check signal source 422 and controller 220.

In operation 530, controller 220 controls the activation of the test or check signal source in the formed test path. For example, the signal sources 214, 320, 420, 422 each may also be used to provide signals for other functions or circuit elements, like measurement functions, of the PCA 200. The signal sources may be decoupled or deactivated during the transition between various functions or circuit elements. For the self-test or self-check functions, the controller 220 may control to activate the respective signal source 214, 320, 420, 422 after the respective test path or check path has been formed.

In operation 540, an electrical property (e.g., a voltage value, a current value, a resistance value, etc.) at a node adjacent to the to-be-tested component in the test or check path is detected and analyzed by the controller 220. For example, controller 220 compares the detected electrical property with stored electrical property information to determine whether the to-be-tested component functions normally or involves dysfunctions. Controller 220 may perform the data analysis of the detected electrical property locally or may work with a remote server or cloud-based computing capacity to perform the data analysis. For example, controller 220 may send the detected electrical property to a remote server for the remote server to compare the detected electrical property with saved electrical property information, and controller 220 may receive the analysis result back from the remote server.

In operation 550, controller 220 presents a result of the self-test operation through the user interface 104. The presentation of the self-test results can be done in various ways, which are all included in the specification. For example, the self-test results may be presented through the display section 150 or via a voice message or alarm. Further, in case one or more safety components are detected as having dysfunction, controller 220 may lock or disable the measurement functions of the DMM to prevent dangers to a user from occurring.

The operations of the self-test or self-check functions are further described with example implementations. Table 1 shows some example self-test or self-check modes or functions.

TABLE 1

| Test | Purpose | Process | Node | Preset Property | Criteria |
|---|---|---|---|---|---|
| Test Lead Check (indicate to short the test leads) | Check whether test leads are open when a user shorts them at this step | 1. Apply current source from 214, through 232, 242, 126, test leads and 124;<br>2. Detect the voltage at node 244, and calculate the resistance by voltage/current source | 244 | Resistance threshold(2Ω) | if < threshold, pass otherwise, fail |
| | Check whether the PTC and R1 is open? | 1. Apply current source from 214, through 232, 242, 126, test leads and 124;<br>2. Detect the voltage at node 245, and calculate the resistance by voltage/current source | 245 add at the right of 232 | Resistance threshold_A(5 kΩ) | if > threshold_A, fail because of open |
| | Check whether the PTC and R1 is short? | 1. Apply current source from 214, through 232, 242,126, test leads and 124;<br>2. Detect the voltage at node 245, and calculate the resistance by voltage/current source | 245 add at the right of 232 | Resistance threshold_B(2.5 kΩ) | if < threshold_B, fail because of short |
| | Check resistor network Rnet (RN1~RN5) is normal? | 1. Apply 2.5 V DC voltage source from 214, through 332 to 314 and then to node of GND (signal GND).<br>2. Detect the voltage of node 318 with A/D converter 212 to calculate the DC voltage reading. | 318 | Voltage threshold(2.5 V +/− 0.5 V) | if within the limit, pass otherwise, fail, because of the Rnet is abnormal. |
| | Check Rnet(RN1~RN5)and R1, C1 are normal? | 1. Apply 2.5 V AC voltage source from 320, through R1, C1 to 314 and then to node of GND (signal GND).<br>2. Detect the voltage of node 318 with converters 330 and 212 to calculate the AC voltage reading. | 318 | Voltage threshold(2.5 V +/− 0.5 V) | if within the limit, pass otherwise, fail, because of the R1, C1 is open. |
| VDC 1500 V | Check the AD Convertor performance of ASIC | 1. Apply DC voltage source 426 to AD converter of ASIC via spring contact and analog switch (in ASIC).<br>2. Check the AD converter output value and then calculate the DC voltage reading. | ADC Output value | Voltage threshold(1500 V +/− 50 V) | if within the limit, pass otherwise, fail, because of the ADC is wrong. |

TABLE 1-continued

| Test | Purpose | Process | Node | Preset Property | Criteria |
|---|---|---|---|---|---|
| VAC 300 V, 60 Hz | Check the RMS-DC performance of ASIC | 1. Apply AC voltage source 420 to RMS-DC of ASIC, then AD converter via spring contact and analog switch (in ASIC). 2. Check the AD converter output value and then calculate the AC voltage reading. | ADC Output value | Voltage threshold(300 V +/− 10 V) | if within the limit, pass otherwise, fail, because of the RMS-DC is wrong. |
| Battery | Check the battery voltage | Detect and calculate battery voltage with AD converter of MCU | ADC Output value of MCU | Low battery threshold(3.3 V) | if less than 3.3 V, low |
| Calibration Date | Check the Calibration Date | Calculate the date to calibration due date | RTC date-calibration date | Just Indicate the days remain | |

As shown in Table 1, in a first self-test example, it is checked whether test leads are open. The test path 240 (FIG. 2) is formed with switch 234 being controlled to be at the off state (switch 234 open). A user is prompted, e.g., via user interface 104, to short the leads coupled to the input terminal 126 and common terminal 124. DC signal source 214 is activated to apply a current flowing through elements 232, 242, 126, test leads, and terminal 124 in the test path 240. The voltage at node 244 is detected, converted by the A/D converter 212, and fed to the controller 220 for analysis. Controller 220 calculates a resistance value by dividing the voltage detected at node 244 by the current value of signal source 214. The calculated resistance value is compared with a stored resistance threshold, e.g., 252. In response to the calculated resistance value being smaller than the resistance threshold, it is determined that the test leads are normal. In response to the calculated resistance value being equal to or greater than the resistance threshold, it is determined that the test leads involve dysfunctions.

In a second self-test example, it is checked whether the PTC circuit 242 is open (disconnected) or short-circuited. The test path 240 (FIG. 2) is formed with switch 234 being controlled to be at the on state (or with test leads shorted). DC signal source 214 is activated to apply a current flowing through elements 232, 242, 126, 234, and 124 in the test path 240. The voltage at node 245 is detected, converted by the A/D converter 212, and fed to the controller 220 for analysis. Controller 220 calculates a resistance value by dividing the voltage detected at node 245 by the current value of signal source 214. The calculated resistance value is compared with stored resistance thresholds. In response to the calculated resistance value being greater than the first resistance threshold of, e.g., 5 kΩ, it is determined that the PTC circuit 242 is disconnected. In response to the calculated resistance value being smaller than a second resistance threshold of, e.g., 2.5 kΩ, it is determined that the PTC circuit 242 is short-circuited.

In a third self-test example, it is checked whether the resistor network (RN1~RN5) is normal. The test path 340 (FIG. 3) is formed. DC signal source 214 is activated to apply a DC voltage signal of, e.g., 2.5V, on the resistive voltage divider circuit 314 to ground 125. A voltage value at the node 318 is detected, converted by the A/D converter 212, and fed to the controller 220 for analysis. In response to the voltage value being within a threshold range of, e.g., 2.0V-3.0V, it is determined that the resistive voltage divider circuit 314 is normal. Otherwise, it is determined that the resistive voltage divider circuit 314 involves dysfunctions.

In a fourth self-test example, it is checked whether the resistor network (RN1~RN5) and the RC series circuit 312 are normal. The test path 310 (FIG. 3) is formed. The AC signal source 320 is activated to apply an AC voltage signal of, e.g., 2.5V, on the RC series circuit 312 and the resistive voltage divider circuit 314 to the ground 125. A voltage value at node 318 is detected, converted by the RMS-to-DC converter 330 and the A/D converter 212, and fed to the controller 220 for analysis. In response to the voltage value being within a threshold range of, e.g., 2.0V-3.0V, it is determined that the resistive voltage divider circuit 314 and the RC series circuit are normal. Otherwise, it is determined that one or more of the resistive voltage divider circuit 314 or the RC series circuit 330 involve dysfunctions.

In a fifth self-test example, the performance of the AD converter 212 is checked. The test path 412 (FIG. 4) is formed. The DC signal source 422 is activated to apply a DC voltage signal of, e.g., 1500V, on the A/D converter 212 of the ASIC via, e.g., spring contact and analog switch (in the ASIC). The output signal of the A/D converter 212 is fed to the controller 220 for analysis. In response to the voltage value being within a threshold range of, e.g., 1450V-1550V, it is determined that the A/D converter 212 is normal. Otherwise, it is determined that the A/D converter 212 involves dysfunctions.

In a sixth self-test example, the performance of the RMS-to-DC converter 330 is checked. The test path 410 (FIG. 4) is formed. The AC signal source 420 is activated to apply an AC voltage signal of, e.g., 300V, 60 Hz, on the RMS-to-DC converter 330. The output of the RMS-to-DC converter 330 is converted by the A/D converter 212 to a digital signal, which is fed to the controller 220 for analysis. In response to the AC voltage value being within a threshold range, e.g., 290V-310V, it is determined that the RMS-to-DC converter 330 is normal. Otherwise, it is determined that the RMS-to-DC converter 330 involves dysfunctions.

In a seventh self-test example, the condition of the battery of the DMM device 100 is checked. The test path 412 (FIG. 4) is formed. A battery is coupled as the signal source 422 to apply a DC voltage signal on the A/D converter 212. The output signal of the A/D converter 212 is fed to the controller 220 for analysis. In response to the corresponding voltage value being less than a threshold of, e.g., 3.3V, it is determined that the battery is low for the normal operation of the DMM device 100.

Controller 220 also stores a record of each self-test or self-check operation, e.g., test date. Depending on the self-test or self-check intervals set up by a user, controller 220 may indicate the next self-test due date or the remaining days toward the next self-test due date.

Further, controller 220 may calculate a further electrical property of a to-be-tested component based on a detected electrical property and compare the calculated electrical property with stored electrical property information to determine an electrical state of the to-be-tested component. For example, in a case that a current source is used as a signal source in a test path, e.g., 214 of FIG. 2, controller 220 may calculate a resistance value based on the voltage value detected at node 245 and the current value of the current source 214 and may compare the calculated resistance value with a respective stored resistance value (e.g., threshold A of 5 kΩ or threshold B of 2.5 kΩ to determine whether the PTC circuit is disconnected or short-circuited.

The switches 232, 234, 332, 318, 334, 424, 426, 428 involved in the formation of the test paths each can be implemented as an analog switch, e.g., a switch based on the spring contact of the control rotary 134, an electrical mechanical switch enabled by a control relays 132, or a transistor, e.g., a p-MOS or n-MOS transistor controlled by electrical signal on a gate terminal thereof. The scope of the specification is not limited by the types of switches used in the formation of the test paths.

Figure 6:
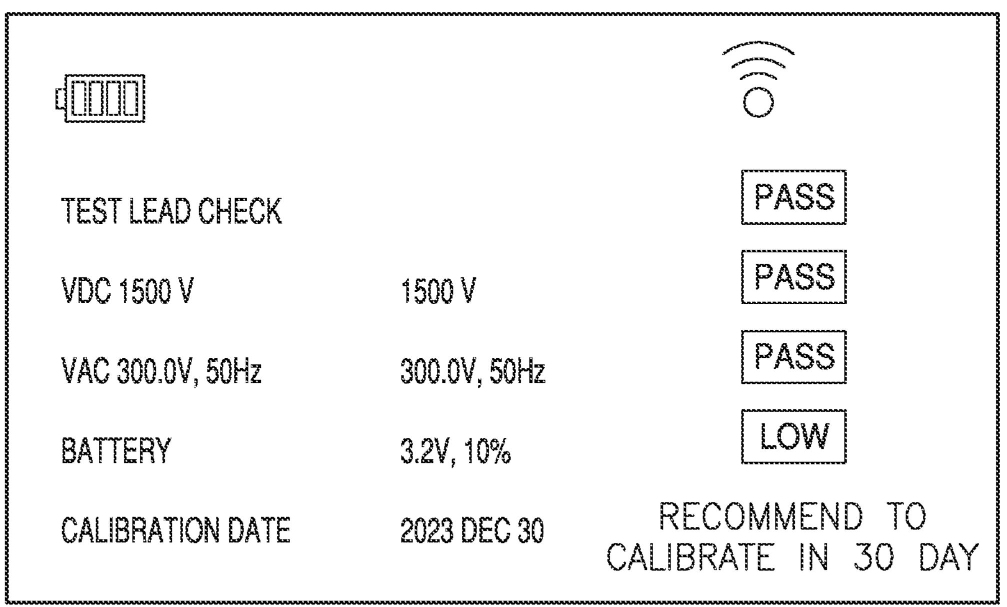
FIG. 6 shows an example presentation of self-test results according to at least one embodiment of the present disclosure.

FIG. 6 shows an example presentation of self-test results through the display section 150. As shown in FIG. 6, the test lead check refers to the self-test mode of testing the PTC circuit 242 by shorting the test leads of a voltage input terminal and the common COM terminal (shown in FIG. 2), and the result of this self-test mode is "PASS," indicating that no dysfunction was found. FIG. 6 also shows that in a check of the A/D converter 212 (FIG. 4), a DC check voltage of 1500V (or simulated 1500V voltage) was applied to the A/D converter 212, and a DV voltage of 1500V was obtained by the controller 220. FIG. 6 also shows that in a check of the RMS-to-DC converter 330 and the A/D converter 212, an AC check voltage of 300.0V, 50 Hz (or simulated 300.0V AC voltage) was applied to the RMS-to-DC converter 330, and an AC voltage of 300.0V, 50 Hz was obtained by the controller 220. Therefore, the result of the self-test includes a quantitative component, e.g., a measured electrical property, and a qualitative component, e.g., pass or fail, to provide users an expedient reading of the health or safety of a to-be-tested component in a circuit in the tester.

It should be appreciated that the various embodiments described above can be combined to provide yet further embodiments of tester 100. Aspects of the embodiments can be modified, and other changes can be made to the embodiments in light of the above-detailed description without departing from the spirit or scope of the disclosure.

For the purposes of the present disclosure, unless otherwise indicated, the phrase "A and B" is nonlimiting and means one or more of (A) and one or more of (B); the phrase "A or B" is nonexclusive and means one or more of (A), one or more of (B), or one or more of (A and B); "A and/or B" means one or more of (A), one or more of (B), or one or more of (A and B); the phrase "at least one of A and B" means at least one of (A) and at least one of (B); the phrase "one or more of A and B" means one or more of (A) and one or more of (B); the phrase "at least one of A or B" means at least one of (A), at least one of (B), or at least one of (A and B); and the phrase "one or more of A or B" means one or more of (A), one or more of (B), or one or more of (A and B). By way of extension, for example, the phrase "at least one of A, B, or C" means at least one of (A), at least one of (B), at least one of (C), at least one of (A and B), at least one of (A and C), at least one of (B and C), or at least one of (A, B and C). In the above, A, B, and C represent any form or type of element, feature, arrangement, component, structure, aspect, action, step, or the like.

As used herein, the terms "first," "second," "third," etc., may be used interchangeably to distinguish one component from another and are not intended to signify the location, sequence, order, or importance of an individual component.

Further aspects of this disclosure are provided by the subject matter of the following clauses regarding a tester, a method, and a computer-readable media.

A tester for measuring electrical properties includes a controller to conduct a self-test on a test path. The tester optionally includes a user interface, or a measurement circuit, which optionally includes a to-be-tested component or a signal source. The controller is optionally configured to form a test path by coupling the to-be-tested component between the signal source and a terminal of the tester, e.g., in response to a user input from the user interface.

The controller is optionally configured to detect an electrical property at a node in the test path adjacent to the to-be-tested component and determine a result of the self-test based on the electrical property at the node. The node is optionally coupled to the controller through an analog-to-digital converter, which is optionally coupled to at least one resistor in series. The signal source may be a DC signal source. The to-be-tested component optionally includes a resistive voltage divider circuit. The node may optionally situated between two resistors of the resistive voltage divider circuit. The signal source may be a DC signal source. The to-be-tested component optionally includes a positive temperature coefficient circuit, and the PTC circuit optionally includes a PTC thermistor and a resistor coupled in series.

The test path is optionally configured to short-circuit an input terminal and a common terminal of the tester. The test path optionally includes a switch, e.g., controllable by the controller. The switch may be placed between the input terminal and the common terminal. The to-be-tested component optionally includes an RC series circuit, and the signal source may be an AC signal source. A terminal of the tester may become a reference node in the tester. A test path optionally includes a resistive voltage divider circuit coupled between the RC series circuit and the reference node. The resistive voltage divider circuit optionally includes a first resistor adjacent to the RC series circuit and a second resistor further from the RC series circuit than the first resistor. The resistance value of the first resistor may be greater than the resistance value of the second resistor. The controller may be optionally configured to detect an electrical property at a node between the first resistor and the second resistor, and an RMS-to-DC converter may be optionally coupled between the node and the controller.

The to-be-tested component is optionally located on a semiconductor chip. A signal source is optionally located outside of the semiconductor chip and optionally configured to generate a first voltage signal. The controller can be configured to read a second voltage signal at the terminal of the tester. The to-be-tested component optionally includes an RMS-to-DC converter. The signal source may be an AC signal source. The AC signal source is optionally configured to apply the first voltage signal directly to the RMS-to-DC converter, which is optionally coupled to the controller through an analog-to-digital converter. The to-be-tested component optionally includes an analog-to-digital converter, and the signal source is optionally a DC signal source. The DC signal source is optionally configured to apply the first voltage signal directly to the analog-to-digital converter.

A method of conducting self-tests includes conducting a self-test on any tester, as described above. The method may include any steps of receiving a user input; controlling, based on the user input, one or more switches to couple a signal source in the tester to a to-be-tested component of a measurement circuit of the tester; or conducting a self-test based on an electrical property at a node adjacent to the to-be-tested component.

The method optionally includes steps of receiving the user input through a user selection mechanism on a user interface of the tester. The method optionally includes steps of prompting a user to short a first test lead coupled to a measurement terminal of the tester to a second test lead coupled to a common terminal of the tester for completing the self-test. The method optionally includes steps of detecting the electrical property at the node adjacent to the to-be-tested component; or determining a result of the self-test based on the electrical property. The method optionally includes steps of computing another electrical property based on the electrical property; or comparing the another electrical property with a stored electrical property information. The signal source in the method may be a current source. The electrical property may be a voltage, and the another electrical property may be a resistance. The method optionally includes steps of presenting a result of the self-test through a user interface of the tester. The result of the self-test optionally includes a quantitative component or a qualitative component.

Lastly, one or more non-transitory computer-readable media that store instructions that are executable by one or more processors, is disclosed to implement a computer-implemented method as set forth in any preceding clause.

These and other changes can be made to the embodiments of various testers in light of the above-detailed description. For example, suppose a tester is a battery tester. In that case, the tester will have different circuits and configurations compared to tester 100 in FIG. 1. The battery tester may have more or less terminals than tester 100. For conducting some self-tests in a battery tester, the controller only needs to control internal switches to form a test path (e.g., from a to-be-tested component to an internal signal source) without connecting to any terminals of the battery tester. As the circuits in different testers may differ, the implementation details of the self-tests, the purposes, the processes, the nodes, the preset properties, the criteria, etc., may be adapted based on this disclosure without undue experimentation.

In general, in the following claims, the terms used should not be construed to limit the claims to the specific embodiments disclosed in the specification and the claims but should be construed to include all possible embodiments along with the full scope of equivalents to which such claims are entitled. Accordingly, the claims are not limited by the disclosure.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A tester for measuring electrical properties, comprising:
- a user interface;
- a measurement circuit including a to-be-tested component and a signal source, the to-be-tested component being an integral part of the measurement circuit and internal to the tester; and
- a controller, coupled to the user interface and the measurement circuit, configured to conduct a self-test on a test path formed by coupling the to-be-tested component between the signal source and a ground node of the tester, in response to a user input from the user interface, and configured to determine whether the to-be-tested component involves a dysfunction based on an electrical property detected at a node in the test path adjacent to the to-be-tested component.

2. The tester of claim 1, wherein the electrical property is a voltage at the node, and the controller is configured to determine a result of the self-test based on the voltage at the node and a reference range of voltage values.

3. The tester of claim 2, wherein the node is coupled to the controller through an analog-to-digital converter, which is coupled to at least one resistor in series.

4. The tester of claim 2, wherein the signal source is a DC signal source, and the to-be-tested component includes a resistive voltage divider circuit; and wherein the node is between two resistors of the resistive voltage divider circuit.

5. The tester of claim 1, wherein the signal source is a DC signal source, and the to-be-tested component includes a positive temperature coefficient (PTC) circuit; and wherein the PTC circuit includes a PTC thermistor and a resistor coupled in series.

6. The tester of claim 1, wherein the test path is configured to short-circuit an input terminal and a common terminal of the tester, and wherein the test path includes a switch, controllable by the controller, to be coupled between the input terminal and the common terminal.

7. The tester of claim 1, wherein the to-be-tested component includes an RC series circuit, and the signal source is an AC signal source.

8. The tester of claim 7, wherein the terminal of the tester is a reference node in the tester, and the test path includes a resistive voltage divider circuit coupled between the RC series circuit and the reference node.

9. The tester of claim 8, wherein the resistive voltage divider circuit includes a first resistor adjacent to the RC series circuit and a second resistor further from the RC series circuit than the first resistor, and wherein a first resistance value of the first resistor is greater than a second resistance value of the second resistor.

10. The tester of claim 9, wherein the controller is configured to detect an electrical property at a node between the first resistor and the second resistor, and an RMS-to-DC converter being coupled between the node and the controller.

11. The tester of claim 1, wherein the to-be-tested component is located on a semiconductor chip, the signal source is located outside of the semiconductor chip and configured to generate a first voltage signal, and the controller is configured to read a second voltage signal at the terminal of the tester.

12. The tester of claim 11, wherein the to-be-tested component includes an RMS-to-DC converter, and the signal source is an AC signal source; and wherein the AC signal source is configured to apply the first voltage signal directly to the RMS-to-DC converter, which is coupled to the controller through an analog-to-digital converter.

13. The tester of claim 11, wherein the to-be-tested component includes an analog-to-digital converter, and the signal source is a DC signal source; and wherein the DC signal source is configured to apply the first voltage signal directly to the analog-to-digital converter.

14. A method of conducting self-tests on a tester, comprising:

receiving a user input;

controlling, based on the user input, one or more switches to couple a signal source and a ground node in the tester to a to-be-tested component of a measurement circuit of the tester to form a test path, the to-be-tested component being an integral part of the measurement circuit and internal to the tester, and the to-be-tested component being coupled between the signal source and the ground node in the test path; and conducting a self-test by detecting an electrical property at a node adjacent to the to-be-tested component and determining whether the to-be-tested component involves a dysfunction based on the electrical property detected.

15. The method of claim 14, wherein receiving the user input comprises receiving the user input through a user selection mechanism on a user interface of the tester.

16. The method of claim 14, further comprising:

prompting a user to short a first test lead coupled to a measurement terminal of the tester to a second test lead coupled to a common terminal of the tester for completing the self-test.

17. The method of claim 14, wherein the electrical property is a voltage, and the determining whether the to-be-tested component involves a dysfunction includes analyzing the voltage detected at the node with respect to a reference range of voltage values.

18. The method of claim 14, further comprising:

computing another electrical property based on the electrical property; and comparing the another electrical property with a stored electrical property information.

19. The method of claim 18, wherein the signal source is a current source, the electrical property is a voltage, and the another electrical property is a resistance.

20. The method of claim 14, further comprising:

presenting a qualitative component of a result of the self-test through a user interface of the tester.

* * * * *